United States Patent
Otsuka et al.

(10) Patent No.: US 11,417,543 B2
(45) Date of Patent: Aug. 16, 2022

(54) BONDING APPARATUS AND BONDING METHOD

(71) Applicant: Tokyo Electron Limited, Tokyo (JP)

(72) Inventors: Yoshitaka Otsuka, Koshi (JP);
Munehisa Kodama, Koshi (JP);
Yutaka Yamasaki, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/508,507

(22) Filed: Jul. 11, 2019

(65) Prior Publication Data
US 2020/0020553 A1 Jan. 16, 2020

(30) Foreign Application Priority Data
Jul. 13, 2018 (JP) .............................. JP2018-133060

(51) Int. Cl.
*H01L 21/67* (2006.01)
*H01L 21/683* (2006.01)
*H01L 21/20* (2006.01)

(52) U.S. Cl.
CPC .... *H01L 21/67092* (2013.01); *H01L 21/2007* (2013.01); *H01L 21/6833* (2013.01)

(58) Field of Classification Search
CPC ......... H01L 27/14621; H01L 27/14625; H01L 27/14609; H01L 27/146; H01L 27/14623; H01L 27/14627; H01L 27/1463; H01L 27/1464; H01L 27/14643
See application file for complete search history.

(56) References Cited

U.S. PATENT DOCUMENTS

| | | | | |
|---|---|---|---|---|
| 2010/0139836 A1* | 6/2010 | Horikoshi | ............. | H01L 23/544 156/64 |
| 2013/0128253 A1* | 5/2013 | Mizumura | ........... | G02B 3/0068 355/67 |
| 2013/0133828 A1* | 5/2013 | Yoshitaka | ............... | B29C 65/00 156/382 |
| 2014/0158280 A1* | 6/2014 | Kurimura | ......... | C08F 222/1065 156/247 |

(Continued)

FOREIGN PATENT DOCUMENTS

| | | |
|---|---|---|
| JP | 2005-294800 A | 10/2005 |
| JP | 2016-134446 A | 7/2016 |
| JP | 2017-118000 A | 6/2017 |

*Primary Examiner* — Marcos D. Pizarro
*Assistant Examiner* — Quinton A Brasfield
(74) *Attorney, Agent, or Firm* — Pearne & Gordon LLP (57) ABSTRACT

A bonding apparatus includes a first holder, a second holder, an imaging unit and a moving device. The first holder is configured to hold a first substrate. The second holder is disposed to face the first holder and configured to hold a second substrate to be bonded to the first substrate. The imaging unit includes a first imaging device configured to image a first alignment mark formed on a surface of the first substrate facing the second substrate and a second imaging device configured to image a second alignment mark formed on a surface of the second substrate facing the first substrate. The moving device is configured to move the imaging unit in a first direction and a second direction intersecting with the first direction within a plan region between the first holder and the second holder.

7 Claims, 8 Drawing Sheets

(56) References Cited

U.S. PATENT DOCUMENTS

| | | | |
|---|---|---|---|
| 2016/0001543 A1* | 1/2016 | Akiyama | H01L 21/681 156/379 |
| 2019/0148333 A1* | 5/2019 | Chen | H01L 24/75 438/16 |

* cited by examiner

BONDING APPARATUS AND BONDING METHOD

CROSS-REFERENCE TO RELATED APPLICATION

This application claims the benefit of Japanese Patent Application No. 2018-133060 filed on Jul. 13, 2018, the entire disclosures of which are incorporated herein by reference.

TECHNICAL FIELD

The various aspects and embodiments described herein pertain generally to a bonding apparatus and a bonding method.

BACKGROUND

Conventionally, there is known a technique of bonding substrates such as semiconductor wafers or glass substrates. For example, Patent Document 1 discloses a bonding apparatus in which a first substrate is held by a first holder, a second substrate is held by a second holder placed to face the first holder, and the first substrate and the second substrate are bonded by bringing the first holder and the second holder close to each other.

Patent Document 1: Japanese Patent Laid-open Publication No. 2016-134446

SUMMARY

Exemplary embodiments provide a technique capable of suppressing a position deviation between substrates in a bonding apparatus configured to bond the substrates.

In one exemplary embodiment, a bonding apparatus includes a first holder, a second holder, an imaging unit and a moving device. The first holder is configured to hold a first substrate. The second holder is disposed to face the first holder and configured to hold a second substrate to be bonded to the first substrate. The imaging unit includes a first imaging device configured to image a first alignment mark formed on a surface of the first substrate facing the second substrate and a second imaging device configured to image a second alignment mark formed on a surface of the second substrate facing the first substrate. The moving device is configured to move the imaging unit in a first direction and a second direction intersecting with the first direction within a plan region between the first holder and the second holder.

According to the exemplary embodiment, it is possible to suppress a position deviation between the substrates in the bonding apparatus configured to bond the substrates.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a bonding apparatus and a bonding method according to exemplary embodiments of the present disclosure will be described in detail with reference to the accompanying drawings. However, it should be noted that the bonding apparatus and the bonding method of the present disclosure are not limited to the exemplary embodiments. Further, the various exemplary embodiments can be appropriately combined as long as the contents of processings are not contradictory. Further, in the following exemplary embodiments, same parts will be assigned same reference numerals and redundant description will be omitted.

<Configuration of Bonding System>

Figure 1:
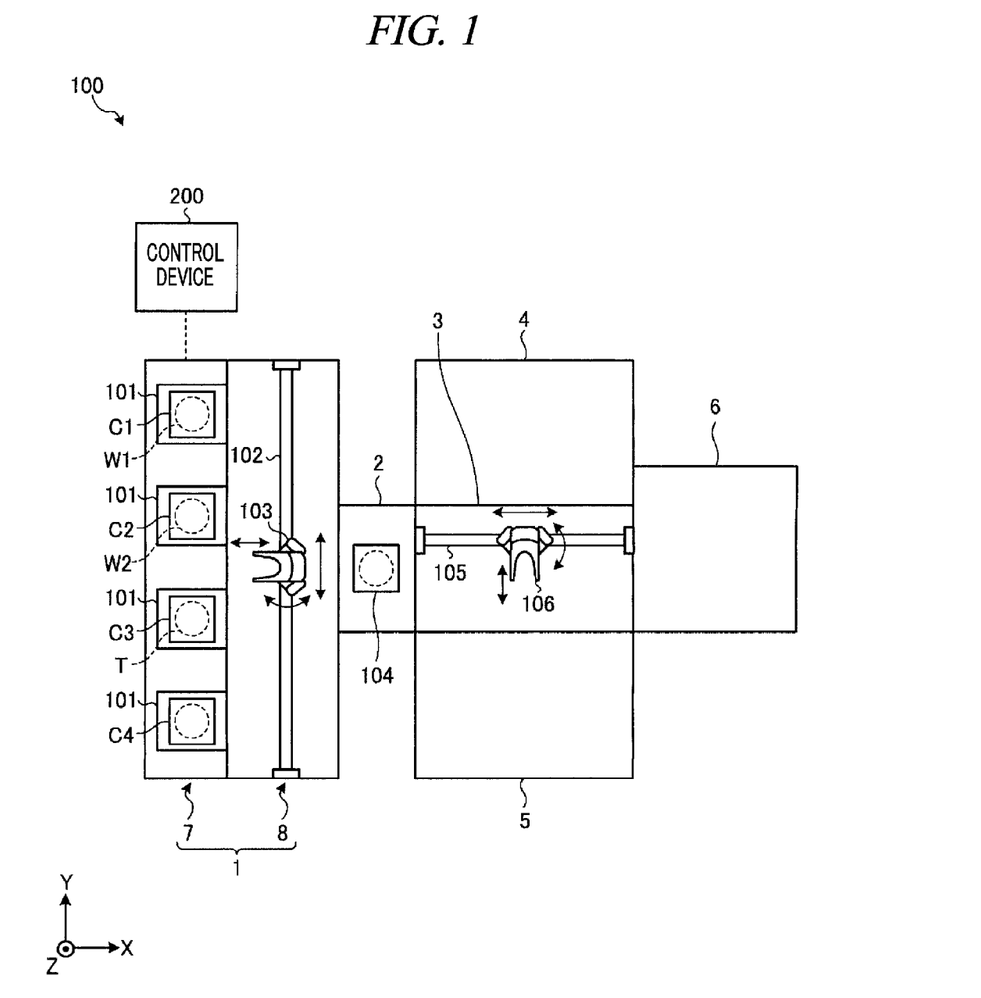
FIG. 1 is a diagram illustrating a configuration example of a bonding system according to an exemplary embodiment.

First, a configuration of a bonding system according to an exemplary embodiment will be explained with reference to FIG. 1. FIG. 1 is a diagram illustrating the configuration example of the bonding system according to the exemplary embodiment. In the following, in order to clarify positional relationships, the X-axis, Y-axis and Z-axis which are orthogonal to each other will be defined. The positive Z-axis direction will be regarded as a vertically upward direction.

A bonding system 100 according to the exemplary embodiment shown in FIG. 1 is configured to produce a combined substrate T by bonding a first substrate W1 and a second substrate W2.

As depicted in FIG. 1, the bonding system 100 includes a carry-in/out block 1, a delivery block 2, a transfer block 3, a surface processing block 4, a normal pressure bonding block 5 and a vacuum bonding block 6.

The carry-in/out block 1 is equipped with a placing table 7 and a transfer region 8. The placing table 7 is equipped with a plurality of (e.g., four) cassette placing plates 101. Cassettes C1 to C4 are placed on the cassette placing plates 101, respectively. Each of the cassettes C1 to C4 is configured to accommodate therein a plurality of (e.g., 25 sheets of) substrates horizontally. The cassette C1 accommodates a plurality of first substrates W1; the cassette C2, a plurality of second substrates W2; and the cassettes C3, a plurality of combined substrates T. The cassette C4 is provided to accommodate, for example, a substrate which has a problem.

The transfer region 8 is disposed adjacent to the placing table 7. A transfer path 102 extended in the Y-axis direction and a transfer device 103 configured to be movable along this transfer path 102 are provided in the transfer region 8. The transfer device 103 is also movable in the X-axis direction and pivotable around the Z-axis, and carries the first substrate W1, the second substrate W2 and the combined substrate T to/from the cassettes C1 to C4 and the delivery block 2.

The delivery block 2 is disposed adjacent to the carry-in/out block 1. The delivery block 2 is equipped with a transit table 104. The transit table 104 is configured to accommodate a plurality of the first substrates W1, the second substrates W2 and the combined substrates T in multiple levels.

The transfer block 3 is disposed adjacent to the delivery block 2. The transfer block 3 is equipped with a transfer path 105 extended in, for example, the X-axis direction and a transfer device 106 configured to be movable along this transfer path 105. The transfer device 106 is also movable in the Y-axis direction and pivotable around the Z-axis, and carries the first substrate W1, the second substrate W2 and the combined substrate T to/from the delivery block 2, the surface processing block 4, the normal pressure bonding block 5 and the vacuum bonding block 6.

The surface processing block 4, the normal pressure bonding block 5 and the vacuum bonding block 6 are disposed adjacent to the transfer block 3.

Disposed in the surface processing block 4 are, for example, a surface hydrophilizing apparatus and a surface modifying apparatus. The surface hydrophilizing apparatus is configured to supply a hydrophilic processing liquid such as pure water to bonding surfaces of the first substrate W1 and the second substrate W2 to thereby hydrophilize these bonding surfaces. The surface modifying apparatus is configured to modify the bonding surfaces of the first substrate W1 and the second substrate W2 by plasma of a processing gas.

Disposed in the normal pressure bonding block 5 is a normal pressure bonding apparatus configured to bond the first substrate W1 and the second substrate W2 in a normal pressure atmosphere. Further, although configurations of the surface hydrophilizing apparatus, the surface modifying apparatus and the normal pressure bonding apparatus are not particularly limited, configurations of a surface hydrophilizing apparatus, a surface modifying apparatus and a bonding apparatus described in, for example, Japanese Patent No. 6,040,123 may be used.

Disposed in the vacuum bonding block 6 is a vacuum bonding apparatus configured to bond the first substrate W1 and the second substrate W2 in a decompressed atmosphere. Configurations of the vacuum bonding block 6 and the vacuum bonding apparatus will be discussed later.

Further, the bonding system 100 is equipped with a control device 200. The control device 200 controls an operation of the bonding system 100. This control device 200 may be, for example, a computer and is equipped with a non-illustrated controller and a non-illustrated storage. The storage is composed of a storage device such as, but not limited to, a RAM (Random Access Memory), a ROM (Read Only Memory) or a hard disk, and stores therein a program for controlling various processings such as a bonding processing. The controller may be, by way of example, but not limitation, a CPU (Central Processing unit) and controls the operation of the bonding system 100 by reading out and executing the program stored in the storage.

Further, the program may be recorded on a computer-readable recording medium and installed from this recording medium to the storage of the control device 200. The computer-readable recording medium may be, by way of non-limiting example, a hard disk (HD), a flexible disk (FD), a compact disk (CD), a magnet optical disk (MO), a memory card, or the like.

<Configuration of Vacuum Bonding Block>

Figure 2:
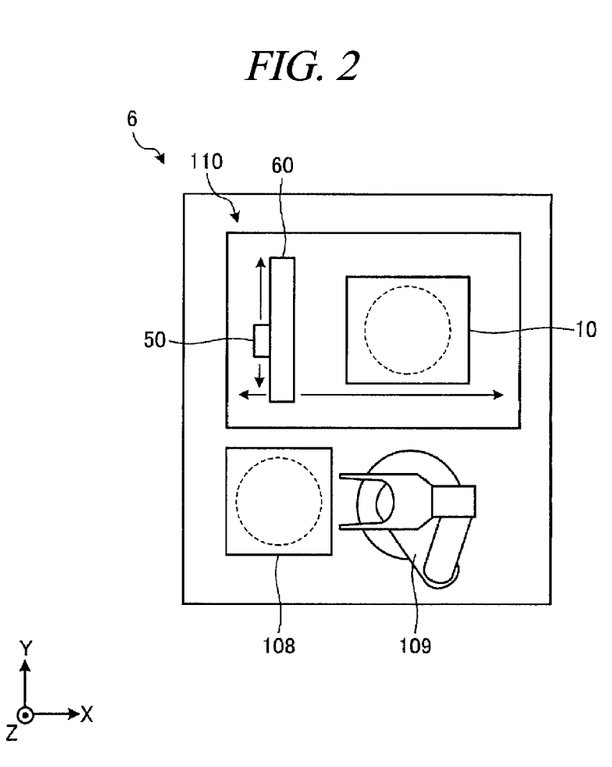
FIG. 2 is a diagram illustrating a configuration example of a vacuum bonding block according to the exemplary embodiment.

Now, a configuration of the vacuum bonding block 6 will be explained with reference to FIG. 2. FIG. 2 is a diagram illustrating the configuration example of the vacuum bonding block 6 according to the exemplary embodiment.

As depicted in FIG. 2, the vacuum bonding block 6 is equipped with a delivery unit 108, a transfer device 109 and a vacuum bonding apparatus 110.

The delivery unit 108 is disposed between the transfer block 3 and the transfer device 109. The delivery unit 108 is capable of holding the first substrate W1, the second substrate W2 and the combined substrate T. By way of example, the delivery unit 108 is equipped with an attracting/holding unit configured to attract and hold the first substrate W1 from above and a plurality of (e.g., three) supporting pins configured to support the second substrate W2 from below. The transfer device 106 provided in the transfer block 3 transfers the first substrate W1 to the attracting/holding unit of the delivery unit 108 with the bonding surface of the first substrate W1 facing downwards. Further, the transfer device 106 transfers the second substrate W2 to the plurality of supporting pins of the delivery unit 108 with the bonding surface of the second substrate W2 facing upwards. Furthermore, the transfer device 106 receives the combined substrate T delivered onto the plurality of supporting pins of the delivery unit 108 by the transfer device 109 to be described later and transfers the received combined substrate T to the transit table 104 of the transfer block 2.

The transfer device 109 is equipped with an arm configured to be extensible/contractible in the horizontal direction and a base configured to be pivotable around the Z-axis. The transfer device 109 performs a carry-in/carry-out of the first substrate W1, the second substrate W2 and the combined substrate T with respect to the delivery unit 108 and the vacuum bonding apparatus 110.

By way of example, the transfer device 109 receives the first substrate W1, which is held by the attracting/holding unit of the delivery unit 108, from the delivery unit 108 by supporting the first substrate W1 from below, and carries the received first substrate W1 into the vacuum bonding apparatus 110. Further, the transfer device 109 receives from the delivery unit 108 the second substrate W2, which is supported by the supporting pins of the delivery unit 108, by supporting the second substrate W2 from below, and carries the received second substrate W2 into the vacuum bonding apparatus 110. Furthermore, the transfer device 109 takes out the combined substrate T from the vacuum bonding apparatus 110 and delivers it onto the supporting pins of the delivery unit 108.

The vacuum bonding apparatus 110 is equipped with a chamber 10 capable of forming a sealed processing space therein. The vacuum bonding apparatus 110 decompresses the chamber 10 after accommodating the first substrate W1 and the second substrate W2 in the chamber 10. Then, the vacuum bonding apparatus 110 bonds the first substrate W1 and the second substrate W2 in a decompressed atmosphere.

Further, the vacuum bonding apparatus 110 is further equipped with: an imaging unit 50 configured to image alignment marks provided on the bonding surfaces of the first substrate W1 and the second substrate W2; and a moving device 60 configured to move the imaging unit 50. The moving device 60 is capable of moving the imaging unit 50 in the X-axis direction and is also capable of moving the imaging unit 50 in the Y-axis direction. Below, a detailed configuration of the vacuum bonding apparatus 110 will be described.

<Configuration of Vacuum Bonding Apparatus>

Figure 3:
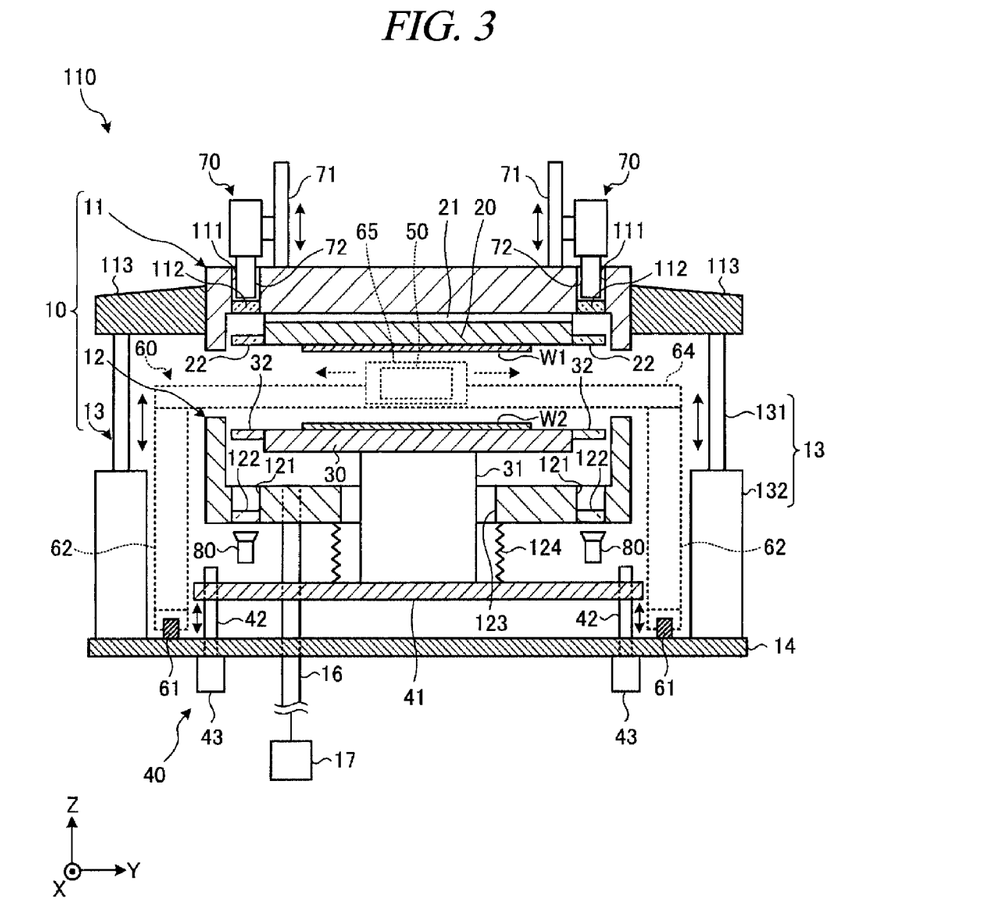
FIG. 3 is a diagram illustrating a configuration example of a vacuum bonding apparatus according to the exemplary embodiment.
Figure 4:
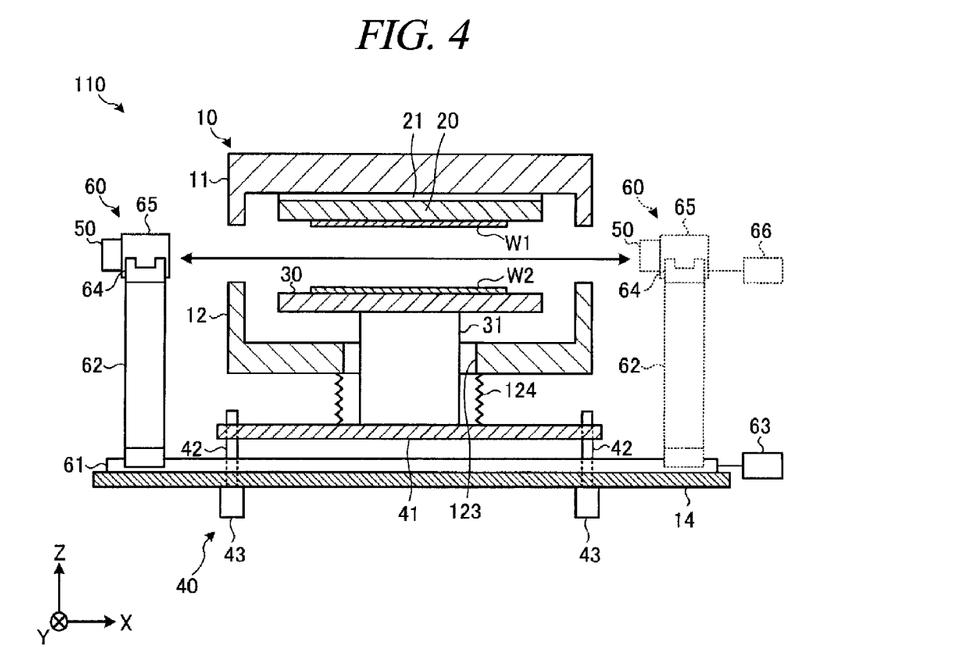
FIG. 4 is a diagram illustrating the configuration example of the vacuum bonding apparatus according to the exemplary embodiment.

FIG. 3 and FIG. 4 are diagrams illustrating a configuration example of the vacuum bonding apparatus 110 according to the exemplary embodiment. FIG. 3 illustrates the vacuum bonding apparatus 110 seen along the X-axis direction, and FIG. 4 illustrates the vacuum bonding apparatus 110 seen along the Y-axis direction.

As depicted in FIG. 3 and FIG. 4, the vacuum bonding apparatus 110 includes the chamber 10, a first holder 20, a second holder 30, an elevator 40, the imaging unit 50, the moving device 60, a plurality of third imaging devices 70 and a plurality of light sources 80.

The chamber 10 is equipped with a first vessel 11, a second vessel 12 and an opening/closing device 13. The first vessel 11 has a concave shape with a side thereof facing the second holder 30 opened (that is, an open bottom), and the first holder 20 is accommodated in this first vessel 11. The second vessel 12 has a concave shape with a side facing the first holder 20 opened (that is, an open top), and the second holder 30 is accommodated in this second vessel 12. The opening/closing device 13 is configured to move the first vessel 11 in the vertical direction. In this chamber 10, by moving the first vessel 11 with the opening/closing device 13 to be brought into contact with the second vessel 12, the sealed processing space is formed within the chamber 10.

A multiple number of through holes 111 is vertically formed through a ceiling of the first vessel 11. These through holes 111 are formed to be located at an outer position than the first holder 20 in a radial direction. Each through hole 111 is closed by a transparent member 112. The transparent member 112 is made of, by way of non-limiting example, quartz glass and disposed in a lower portion of the through hole 111 to be located near the processing space.

A multiple number of through holes 121 is vertically formed through a bottom of the second vessel 12. These through holes 121 are formed to be located at an outer position than the second holder 30 in a radial direction to directly face the through holes 111. Each through hole 121 is closed by a transparent member 122. The transparent member 122 is made of, by way of non-limiting example, quartz glass or the like.

Further, a through hole 123 is vertically formed through a center of the bottom of the second vessel 12. A shaft 31 to be described later is inserted through this through hole 123. Furthermore, one end of a cylindrical bellows 124 is connected to a center of a bottom surface of the second vessel 12. The bellows 124 is configured to surround the through hole 123. The other end of the bellows 124 is connected to a top surface of a supporting plate 41 of the elevator 40 to be described later.

An exhaust pipe 16 for evacuating the chamber 10 is connected to the bottom of the second vessel 12. The exhaust pipe 16 is connected to an exhaust device 17 such as a vacuum pump.

The opening/closing device 13 is equipped with a plurality of (e.g., two) shafts 131 and a plurality of drivers 132. Each shaft 131 is vertically extended, and a leading end thereof is connected to a flange 113 protruded outwards from an outer edge of the first vessel 11. The driver 132 moves the shaft 131 in the vertical direction. The driver 132 is fixed to a top surface of a base plate 14 provided under the second vessel 12.

The first holder 20 is a holder configured to attract and hold the first substrate W1, and is accommodated within the first vessel 11 with a holding surface thereof facing downwards. The first substrate W1 is held by the first holder 20 with the bonding surface to be bonded to the second substrate W2 facing downwards.

The first holder 20 has, for example, a non-illustrated internal electrode, and is capable of attracting the first substrate W1 to the holding surface by using an electrostatic force generated by applying a voltage to the internal electrode. Further, the first holder 20 may be connected to a non-illustrated evacuating device such as a vacuum pump via a non-illustrated evacuation pipe, and may attract the first substrate W1 to the holding surface by an evacuating force generated by the evacuating device.

An adjuster 21 configured to adjust a horizontal position of the first holder 20 is provided at an upper portion of the first holder 20. The adjuster 21 is capable of moving the first holder 20 in the X-axis direction or in the Y-axis direction. Further, the adjuster 21 is also capable of rotating the first holder 20 around the vertical axis. That is, the adjuster 21 is capable of changing a direction of the first holder 20 in the horizontal direction.

A plurality of transparent members 22 is provided at an outer edge of the first holder 20. Each transparent member 22 is made of, by way of example, quartz glass or the like. An alignment mark (hereinafter, referred to as "first chuck mark") for use in a second fine alignment processing to be described later is formed at each transparent member 22 by, for example, metal deposition or the like.

The second holder 30 is a holder configured to attract and hold the second substrate W2, and is accommodated within the second vessel 12 with a holding surface thereof facing upwards. The second substrate W2 is held by the second holder 30 with the bonding surface to be bonded to the first substrate W1 facing upwards. Like the first holder 20, the second holder 30 may attract the second substrate W2 to the holding surface thereof by using the electrostatic force or the evacuating force.

A leading end of the shaft 31 which is extended in the vertical direction is connected to a lower portion of the second holder 30. The shaft 31 is inserted through the through hole 123 of the second vessel 12 and is covered by the bellows 124. A lower end of the shaft 31 is connected to the supporting plate 41 of the elevator 40 to be described later.

A plurality of transparent members 32 is provided at an outer edge of the second holder 30. Each transparent member 32 is made of, by way of example, quartz glass or the like. Like the transparent member 22, a second chuck mark for use in the second fine alignment processing to be described later is formed at each transparent member 32 by, for example, metal deposition or the like.

The elevator 40 is equipped with the supporting plate 41, a plurality of supporting column members 42 and a plurality of drivers 43. The supporting plate 41 is a flat plate disposed between the second vessel 12 and the base plate 14. Leading ends of the supporting column members 42 are connected to the supporting plate 41, and the other ends of the supporting column members 42 are respectively connected to the drivers 43. Each driver 43 is configured to move the corresponding supporting column member 42 in the vertical direction. The drivers 43 are fixed to the base plate 14.

The elevator 40 moves up the supporting column members 42 and the supporting plate 41 by using the plurality of drivers 43, thus raising the shaft 31 connected to the supporting plate 41 and the second holder 30 connected to the shaft 31. Further, the elevator 40 is capable of adjusting a degree of horizontality of the second holder 30 by moving the plurality of supporting column members 42 individually.

Figure 5:
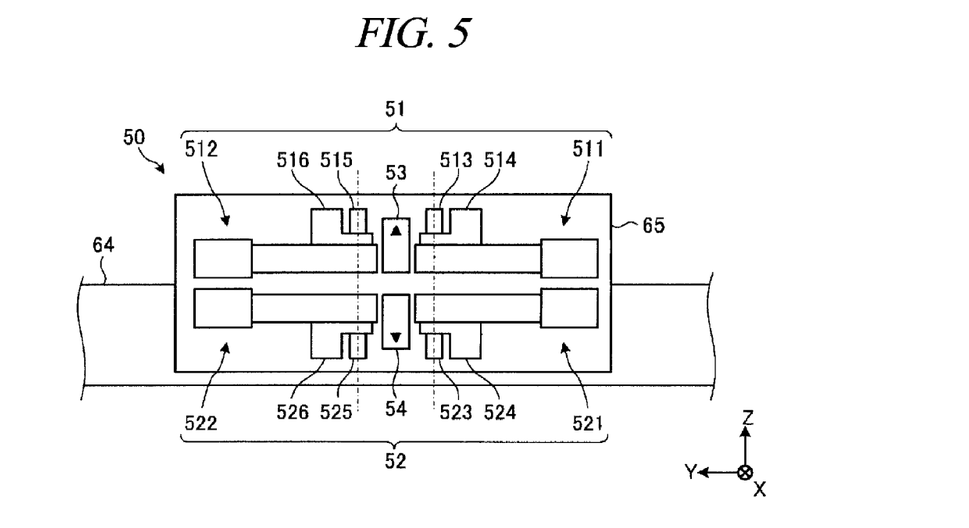
FIG. 5 is a diagram illustrating a configuration example of an imaging unit.

The imaging unit 50 images the alignment mark provided on the first substrate W1 and the alignment mark provided on the second substrate W2. Here, a configuration of the imaging unit 50 will be elaborated with reference to FIG. 5. FIG. 5 is a diagram illustrating the configuration example of the imaging unit.

As depicted in FIG. 5, the imaging unit 50 includes a first imaging device 51, a second imaging device 52, a first displacement sensor 53 and a second displacement sensor 54, which are configured as a single body.

The first imaging device 51 images a first alignment mark provided on a bottom surface of the first substrate W1. To elaborate, the first imaging device 51 includes a first wide-area imaging module 511 and a first local imaging module 512. The first wide-area imaging module 511 is equipped with a first wide-area objective lens 513 and a first wide-area focusing device 514 configured to adjust a height position of the first wide-area objective lens 513. Further, the first local imaging module 512 is equipped with a first local objective lens 515 and a first local focusing device 516 configured to adjust a height position of the first local objective lens 515. The first wide-area objective lens 513 is, for example, a macro lens, and the first local objective lens 515 is a micro lens having a magnification higher than that of the first wide-area objective lens 513.

The first imaging device 51 is capable of imaging the bottom surface of the first substrate W1 in a relatively wide range by using the first wide-area imaging module 511. Further, the first imaging device 51 is capable of imaging the first alignment mark provided on the bottom surface of the first substrate W1 by using the first local imaging module 512 with higher accuracy than in case of using the first wide-area imaging module 511. Further, the first imaging device 51 is capable of focusing the first wide-area objective lens 513 and the first local objective lens 515 on the bottom surface of the first substrate W1 by using the first wide-area focusing device 514 and the first local focusing device 516.

The second imaging device 52 images a second alignment mark provided on the top surface of the second substrate W2. To elaborate, the second imaging device 52 includes a second wide-area imaging module 521 and a second local imaging module 522. The second wide-area imaging module 521 is equipped with a second wide-area objective lens 523 and a second wide-area focusing device 524 configured to adjust a height position of the second wide-area objective lens 523. Further, the second local imaging module 522 is equipped with a second topical objective lens 525 and a second local focusing device 526 configured to adjust a height position of the second topical objective lens 525. The second wide-area objective lens 523 may be, by way of example, but not limitation, a macro lens, and the second topical objective lens 525 is a micro lens having a magnification higher than that of the second wide-area objective lens 523.

The second imaging device 52 is capable of imaging the top surface of the second substrate W2 in a relatively wide range by using the second wide-area imaging module 521. Further, the second imaging device 52 is also capable of imaging the second alignment mark provided on the top surface of the second substrate W2 by using the second local imaging module 522 with higher accuracy than in case of using the second wide-area imaging module 521. Furthermore, the second imaging device 52 is capable of focusing the second wide-area objective lens 523 and the second topical objective lens 525 on the top surface of the second substrate W2 by using the second wide-area focusing device 524 and the second local focusing device 526.

The first wide-area imaging module 511 and the first local imaging module 512 are fastened to a mount 65 of the moving device 60 to be describe later with the first wide-area objective lens 513 and the first local objective lens 515 facing upwards. Further, the second wide-area imaging module 521 and the second local imaging module 522 are fastened to the mount 65 of the moving device 60 to be described later to be vertically symmetrical with respect to the first wide-area imaging module 511 and the first local imaging module 512. That is, the second wide-area imaging module 521 is placed under the first wide-area imaging module 511 with the second wide-area objective lens 523 facing downwards. Further, the second local imaging module 522 is disposed under the first local imaging module 512 with the second topical objective lens 525 facing downwards.

The imaging unit 50 is configured as stated above, and is capable of imaging the first alignment mark provided on the first substrate W1 and the second alignment mark provided on the second substrate W2 at the same time by using the first imaging device 51 and the second imaging device 52.

An optical axis of the first wide-area objective lens 513 belonging to the first wide-area imaging module 511 and an optical axis of the second wide-area objective lens 523 belonging to the second wide-area imaging module 521 are both vertically extended and lie on the same straight line. Accordingly, when a region on the first substrate W1 centered on certain coordinates is imaged by the first wide-area imaging module 511, for example, a region on the second substrate W2 centered on the same coordinates can be imaged by the second wide-area imaging module 521. Thus, in the pre-alignment processing to be described later, it is easy to perform a processing of aligning the position of the first alignment mark provided on the first substrate W1 with the position of the second alignment mark provided on the second substrate W2.

Likewise, an optical axis of the first local objective lens 515 belonging to the first local imaging module 512 and an optical axis of the second topical objective lens 525 belonging to the second local imaging module 522 are both vertically extended and lie on the same straight line. Accordingly, when a region on the first substrate W1 centered on certain coordinates is imaged by the first local imaging module 512, for example, a region on the second substrate W2 centered on the same coordinates can be imaged by the second local imaging module 522. Thus, in the first fine alignment processing to be described later, it is easy to perform a processing of aligning the position of the first alignment mark provided on the first substrate W1 with the position of the second alignment mark provided on the second substrate W2.

The first displacement sensor 53 and the second displacement sensor 54 are, for example, displacement meters. The first displacement sensor 53 measures a distance to the bottom surface of the first substrate W1 by irradiating laser light to the bottom surface of the first substrate W1 and receiving reflection light thereof. Likewise, the second displacement sensor 54 measures a distance to the top surface of the second substrate W2 by irradiating laser light to the top surface of the second substrate W2 and receiving reflection light thereof. The first displacement sensor 53 is disposed between the first wide-area imaging module 511 and the first local imaging module 512, and the second displacement sensor 54 is disposed between the second wide-area imaging module 521 and the second local imaging module 522.

Referring back to FIG. 3 and FIG. 4, the moving device 60 will be described. The moving device 60 moves the imaging unit 50 in the X-axis direction and the Y-axis direction in a plan region between the first holder 20 and the second holder 30.

The alignment mark may not always be provided on the same position with respect to the substrate. For example, the alignment mark may be provided on a periphery of the substrate or a position inner than that. According to the vacuum bonding apparatus 110 of the present exemplary embodiment, even when the alignment mark is provided on a certain position, the imaging unit 50 can be moved to the corresponding position by using the moving device 60.

Further, since the moving device 60 moves the first imaging device 51 and the second imaging device 52 as one body, a deviation in imaging positions between the first imaging device 51 and the second imaging device 52 which might be caused by a movement thereof may hardly occur.

As illustrated in FIG. 3 and FIG. 4, the moving device 60 has a door shape, and is equipped with a pair of first extending members 61, a pair of legs 62, a pair of first drivers 63, a second extending member 64, the mount 65 and a second driver 66.

The pair of the first extending members 61 include, by way of example, a ball screw and a linear guide. The pair of the first extending members 61 is fixed on the base plate 14 and extended in the X-axis direction.

The pair of the first extending members 61 is disposed at an outer position than the chamber 10 and an inner position than the opening/closing device 13. To elaborate, one of the first extending members 61 is disposed at a negative Y-axis side of the chamber 10 and a positive Y-axis side of the opening/closing device 13, while the other first extending member 61 is disposed at a positive Y-axis side of the chamber 10 and a negative Y-axis side of the opening/closing device 13.

The pair of legs 62 is vertically extended and is connected to the pair of first extending members 61. Each of the first drivers 63 includes, for example, a motor. The first drivers 63 move the pair of legs 62 along the first extending members 61.

The second extending member 64 includes, by way of example, a ball screw, a linear guide, and so forth. The second extending member 64 is extended along the Y-axis direction by being suspended by the pair of legs 62.

The mount 65 is connected to the second extending member 64. The imaging unit 50 is fastened to the mount 65. The second driver 66 includes, by way of example, a motor and moves the mount 65 and the imaging unit 50 fastened to the mount 65 along the second extending member 64.

With this moving device 60, by moving the pair of legs 62 in the X-axis direction, the imaging unit 50 can be moved between an imaging position between the first holder 20 and the second holder 30 and a retreat position at an outside of the chamber 10. Further, with this moving device 60, by moving the pair of legs 62 in the X-axis direction and the mount 65 in the Y-axis direction, the imaging unit 50 can be placed at various imaging positions in the plan region between the first holder 20 and the second holder 30.

As depicted in FIG. 3, each of the third imaging devices 70 is connected to an upper portion of the first vessel 11 of the chamber 10 with an elevator 71 therebetween. The elevator 71 adjusts a height position of the third imaging device 70. Further, the third imaging device 70 has an objective lens 72. At least a part of the objective lens 72 is placed within the through hole 111 formed through the first vessel 11.

As stated above, in the vacuum bonding apparatus 110 according to the exemplary embodiment, the through holes 111 are provided through the first vessel 11, and the objective lenses 72 of the third imaging devices 70 are disposed within the through holes 111. Accordingly, the objective lenses 72 can be made to be placed closer to the first chuck mark and the second chuck mark on the transparent members 22 and 32 as observation targets. Thus, even if a focal length of the objective lenses 72 is short, the objective lenses 72 can be appropriately focused on the first chuck mark and the second chuck mark.

Each third imaging device 70 is configured to image the first chuck mark formed on the transparent member 22 through the transparent member 112. Further, the third imaging device 70 images the second chuck mark on the transparent member 32 through the transparent member 112 and the transparent member 22.

Each light source 80 is disposed under the second vessel 12 within the chamber 10 with an optical axis thereof facing vertically upwards. The light source 80 irradiates light to the inside of the processing space via the transparent member 122. The light irradiated from the light source 80 may be, by way of non-limiting example, infrared light. Further, the light irradiated from the light source 80 may be laser light.

The light irradiated from the light source 80 to the inside of the processing space via the transparent member 122 arrives at the objective lens 72 of the third imaging device 70 via the transparent member 32, the transparent member 22 and the transparent member 112.

<Specific Operation of Vacuum Bonding Apparatus>

Figure 6:
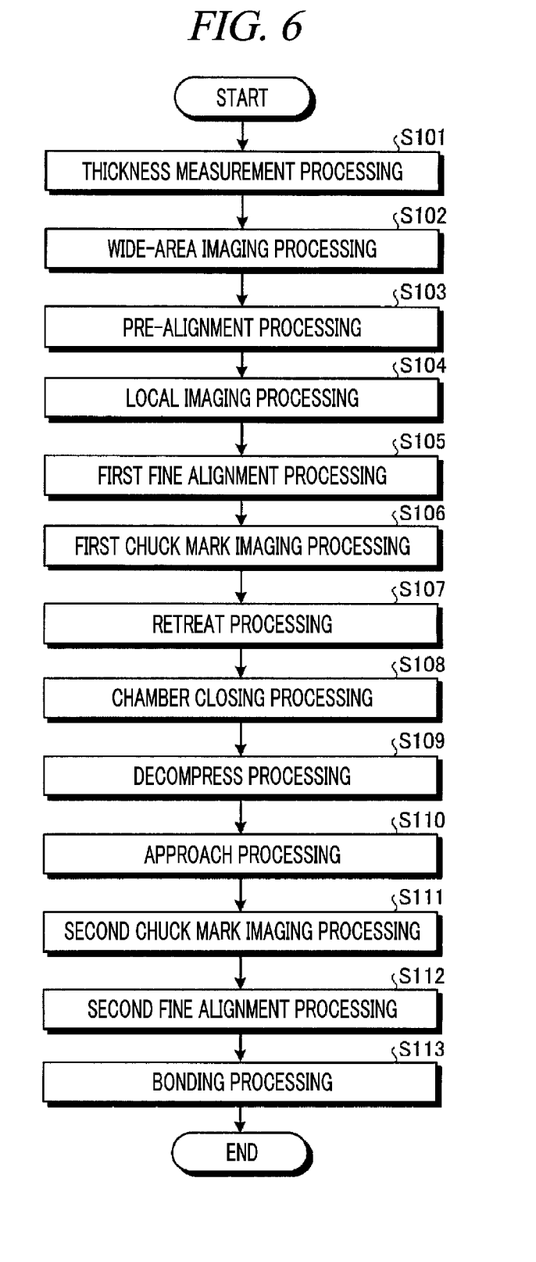
FIG. 6 is a flowchart illustrating an example of a sequence of a series of processings performed in the vacuum bonding apparatus.
Figure 7:
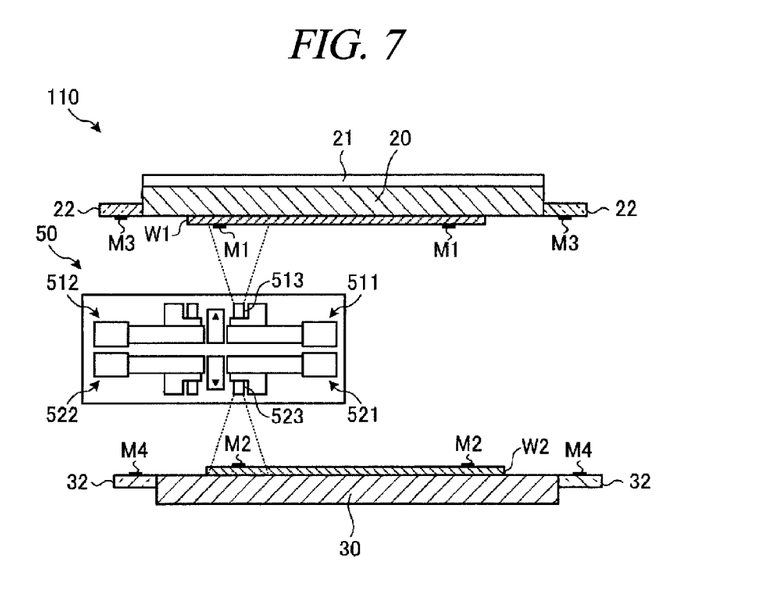
FIG. 7 is a diagram illustrating an operation example of a wide-area imaging processing.
Figure 8:
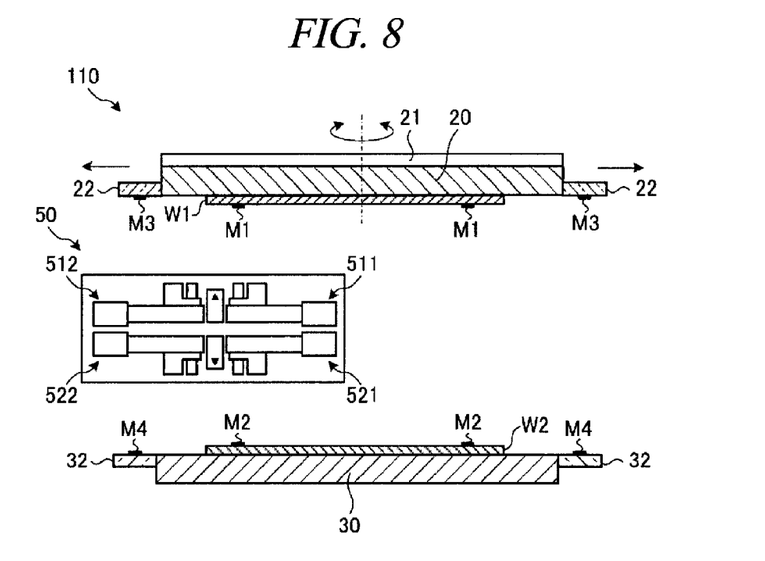
FIG. 8 is a diagram illustrating an operation example of a pre-alignment processing.
Figure 9:
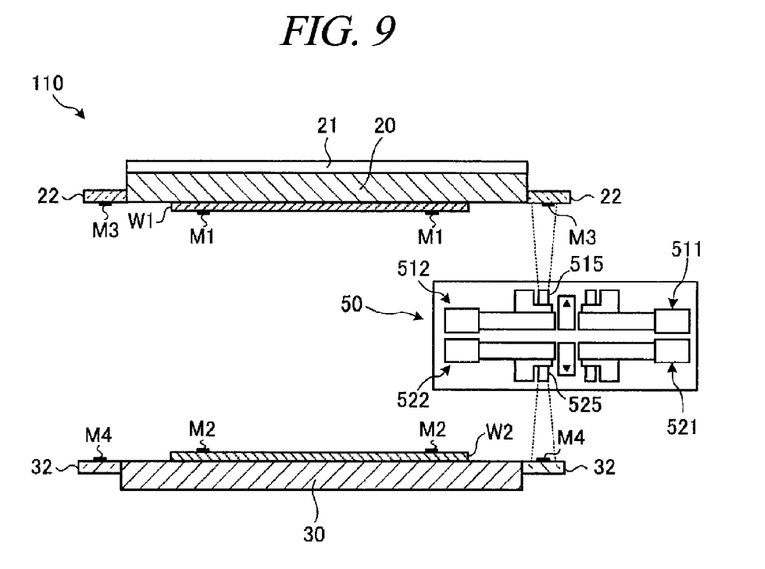
FIG. 9 is a diagram illustrating an operation example of a first chuck mark imaging processing.
Figure 10:
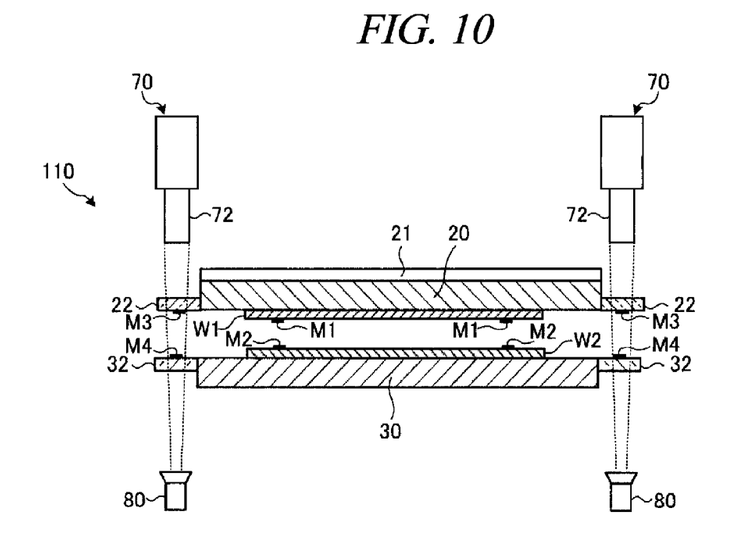
FIG. 10 is a diagram illustrating an operation example of a second chuck mark imaging processing.
Figure 11:
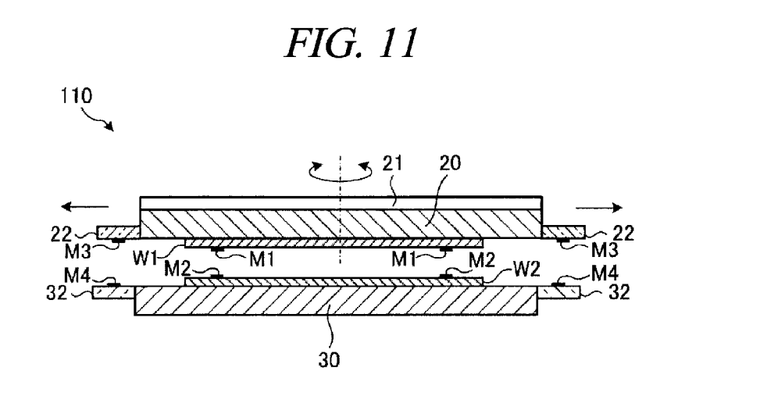
FIG. 11 is a diagram illustrating an operation example of a second fine alignment processing.

Now, a series of processings performed in the vacuum bonding apparatus 110 will be explained with reference to FIG. 6 to FIG. 11. FIG. 6 is a flowchart showing an example of the series of processings performed in the vacuum bonding apparatus 110. Further, FIG. 7 is a diagram illustrating an example operation of a wide-area imaging processing, and FIG. 8 is a diagram illustrating an example operation of a pre-alignment processing. Further, FIG. 9 is a diagram illustrating an operation example of a first chuck mark imaging processing, and FIG. 10 is a diagram illustrating an operation example of a second chuck mark imaging processing. FIG. 11 is a diagram illustrating an operation example of a second fine alignment processing.

Further, each processing shown in FIG. 6 is performed as the controller of the control device 200 reads out the program stored in the storage of the control device 200 and controls the vacuum bonding apparatus 110 based on the read command. Further, FIG. 6 shows the sequence of the respective processings performed after the first substrate W1 is held by the first holder 20 and the second substrate W2 is held by the second holder 30. Prior to the start of a process S101, the chamber 10 is in an open state, that is, in a state where the first vessel 11 is raised.

As shown in FIG. 6, in the vacuum bonding apparatus 110, a thickness measurement processing is first performed (process S101). In the thickness measurement processing, the imaging unit 50 is moved to a thickness measurement position between the first holder 20 and the second holder 30 from the retreat position at the outside of the chamber 10. Then, the distance from the imaging unit 50 to the bottom surface of the first substrate W1 is measured by using the first displacement sensor 53, and the distance from the imaging unit 50 to the top surface of the second substrate W2 is measured by using the second displacement sensor 54. Measurement results by the first displacement sensor 53 and the second displacement sensor 54 are outputted to the control device 200.

The control device 200 calculates a thickness of the first substrate W1 by using the measurement result from the first displacement sensor 53 and a previously acquired distance from the imaging unit 50 to the holding surface of the first holder 20. Likewise, the control device 200 calculates a thickness of the second substrate W2 by using the measurement result from the second displacement sensor 54 and a previously acquired distance from the imaging unit 50 to the holding surface of the second holder 30.

Subsequently, in the vacuum bonding apparatus 110, a wide-area imaging processing is performed (process S102). In the wide-area imaging processing, by using the moving device 60, the second wide-area imaging module 521 of the imaging unit 50 is moved to a preset imaging position corresponding to, for example, a position of the second substrate W2 where a second alignment mark M2 is formed. Then, a first alignment mark M1 of the first substrate W1 is imaged by using the first wide-area imaging module 511 of the imaging unit 50, and the second alignment mark M2 of the second substrate W2 is imaged by using the second wide-area imaging module 521 (see FIG. 7). Imaging results of the first wide-area imaging module 511 and the second wide-area imaging module 521 are outputted to the control device 200.

Then, a pre-alignment processing is performed in the vacuum bonding apparatus 110 (process S103). In the pre-alignment processing, the horizontal position of the first holder 20 is adjusted by controlling the adjuster 21 based on the imaging results of the first wide-area imaging module 511 and the second wide-area imaging module 521 (see FIG. 8).

By way of example, the first alignment mark M1 has a cross shape, and the second alignment mark M2 has a shape obtained by cutting the inside of the rectangle in the cross shape. In the pre-alignment processing, by adjusting the horizontal position of the first holder 20 by using the adjuster 21, the cross shape of the first alignment mark M1 and the cross shape of the second alignment mark M2 are overlapped. Further, the processings of the process S102 and the process S103 may be repeated multiple times until a deviation between the position of the first alignment mark M1 and the position of the second alignment mark M2 falls within a threshold value.

Thereafter, in the vacuum bonding apparatus 110, a local imaging processing is performed (process S104). In the local imaging processing, by using the moving device 60, the second local imaging module 522 of the imaging unit 50 is moved to, for example, the position of the second alignment mark M2 detected in the wide-area imaging processing. Then, the first alignment mark M1 provided on the bottom surface of the first substrate W1 is imaged by using the first local imaging module 512 of the imaging unit 50. Further, the second alignment mark M2 provided on the top surface of the second substrate W2 is imaged by using the second local imaging module 522 of the imaging unit 50. Imaging results of the first local imaging module 512 and the second local imaging module 522 are outputted to the control device 200.

Subsequently, in the vacuum bonding apparatus 110, a first fine alignment processing is performed (process S105). In the first fine alignment processing, the horizontal position of the first holder 20 is further adjusted by controlling the adjuster 21 based on the imaging results of the first local imaging module 512 and the second local imaging module 522. Accordingly, the first substrate W1 and the second substrate W2 come into a position-determined state. Further, the processings of the process S104 and the process S105 may be repeated multiple times until the deviation between the position of the first alignment mark M1 and the position of the second alignment mark M2 falls within the threshold value.

Thereafter, in the vacuum bonding apparatus 110, a first chuck mark imaging processing is carried out (process S106). In the first chuck mark imaging processing, by using the moving device 60, the second local imaging module 522 of the imaging unit 50 is moved to, for example, a preset imaging position corresponding to a position where a second chuck mark M4 of the transparent member 32 is formed. Then, a first chuck mark M3 of the transparent member 22 is imaged by using the first local imaging module 512 of the imaging unit 50, and the second chuck mark M4 of the transparent member 32 is imaged by using the second local imaging module 522 (see FIG. 9). Imaging results of the first local imaging module 512 and the second local imaging module 522 are outputted to the control device 200 and stored in the storage as information showing a positional relationship between the first chuck mark M3 and the second chuck mark M4 in the state that the positioning of the first substrate W1 and the second substrate W2 is completed.

Afterwards, in the vacuum bonding apparatus 110, a retreat processing is performed (process S107). In the retreat processing, the imaging unit 50 is moved to the retreat position at the outside of the chamber 10 by using the moving device 60.

Then, in the vacuum bonding apparatus 110, a chamber closing processing is performed (process S108). In the chamber closing processing, by lowering the first vessel 11 by using the opening/closing device 13, the first vessel 11 is brought into contact with the second vessel 12. Accordingly, the sealed processing space is formed within the first vessel 11. As the chamber closing processing is performed, the first substrate W1 held by the first holder 20 is made to come close to the second substrate W2 held by the second holder 30 but without being in contact with the second substrate W2.

Next, in the vacuum bonding apparatus 110, a decompress processing is performed (process S109). In the decompress processing, by evacuating the chamber 10 through the exhaust device 17, the processing space is decompressed. Accordingly, the inside of the chamber 10 of the vacuum bonding apparatus 110 is turned into a high vacuum state equal to or less than, e.g., 0.005 Pa.

Subsequently, in the vacuum bonding apparatus 110, an approach processing is performed (process S110). In the approach processing, the second holder 30 is moved up by using the elevator 40 so that the gap between the first substrate W1 and the second substrate W2 has a predetermined value (e.g., 100 μm). A distance by which the second holder 30 is raised is determined based on the thicknesses of the first substrate W1 and the second substrate W2 measured in the thickness measurement processing of the process S101.

Here, in the chamber closing processing, if a moving direction of the first vessel 11 is deviated from the vertical direction, the horizontal position of the first substrate W1 is deviated. As a result, the position-determined state of the first substrate W1 and the second substrate W2 in the first fine alignment processing may be disturbed. In the approach processing, the same problem may occur if a moving direction of the second vessel 12 is deviated from the vertical direction. As a resolution, the second chuck mark imaging processing and the second fine alignment processing to be described later are performed in the vacuum bonding apparatus 110.

First, in the vacuum bonding apparatus 110, the second chuck mark imaging processing is performed (process S111). In the second chuck mark imaging processing, by moving the third imaging device 70 through the elevator 71, the objective lens 72 is focused on the second chuck mark M4 of the transparent member 32. Thereafter, while irradiating the light from the light source 80, the second chuck mark M4 of the transparent member 32 is imaged by the third imaging device 70 (see FIG. 10). Then, by moving the third imaging device 70 through the elevator 71, the objective lens 72 is focused on the first chuck mark M3 of the transparent member 22. Thereafter, while irradiating the light from the light source 80, the first chuck mark M3 of the transparent member 22 is imaged by the third imaging device 70. Imaging results by the third imaging device 70 are outputted to the control device 200.

Subsequently, in the vacuum bonding apparatus 110, the second fine alignment processing is performed (process S112). In the second fine alignment processing, the control device 200 acquires, from the imaging results by the third imaging device 70, information upon a positional relationship between the first chuck mark M3 and the second chuck mark M4 after the approach processing. Then, the control device 200 adjusts the horizontal position of the first holder 20 by using the adjuster 21 so that the positional relationship between the chuck marks M3 and M4 after the approach processing coincides with the positional relationship between the chuck marks M3 and M4 after the first fine alignment processing (see FIG. 11).

As stated above, in the vacuum bonding apparatus 110, after bringing the first substrate W1 and the second substrate W2 close to each other by moving the first holder 20 and the second holder 30, the alignment processing is performed again based on the first chuck mark M3 and the second chuck mark M4. Accordingly, even if the position-determined state of the first substrate W1 and the second substrate W2 is disturbed due to the movement of the first holder 20 and the second holder 30, the first substrate W1 and the second substrate W2 can be returned back, before the bonding processing, to the state where they are position-determined. Thus, the first substrate W1 and the second substrate W2 can be bonded with high accuracy.

Then, in the vacuum bonding apparatus 110, the bonding processing is carried out (process S113). In the bonding processing, by further moving the second holder 30 upwards through the elevator 40, for example, the first substrate W1 and the second substrate W2 are brought into pressurized contact with each other to be bonded to each other. Further, the vacuum bonding apparatus 110 may be further equipped with a pushing device configured to lift the shaft 31 upwards by being contacted with the shaft 31 from below the shaft 31. In this configuration, the vacuum bonding apparatus 110 can press the first substrate W1 and the second substrate W2 with a larger force by the pushing device.

Afterwards, after releasing the attraction and holding of the first substrate W1 from the first holder 20 and opening the inside of the chamber 10 to the atmosphere, the first vessel 11 is raised by the opening/closing device 13. Then, by releasing the attraction and holding of the second substrate W2 from the second holder 30 and by raising non-illustrated multiple (e.g., three) supporting pins provided at the second holder 30, the combined substrate T is set into a state where it floats from the second holder 30. Then, the combined substrate T is taken out of the vacuum bonding apparatus 110 by the transfer device 109 and delivered to the delivery unit 108.

Then, the transfer device 106 of the transfer block 3 takes out the combined substrate T from the delivery unit 108 of the vacuum bonding block 6 and delivers the combined substrate T to the transit table 104 of the delivery block 2. Thereafter, the transfer device 103 of the carry-in/out block 1 takes out the combined substrate T from the transit table 104 of the delivery block 2 and accommodates the combined substrate T in the cassette C3 placed on the cassette placing plate 101. Accordingly, the series of the processings are ended.

<Modification Examples>

The above exemplary embodiment has been described for the example where the imaging unit 50 is supported by the door-shaped moving device 60. However, the moving device 60 does not necessarily have the door shape. By way of example, the moving device 60 may be configured to support the imaging unit 50 with a cantilever structure. That is, the moving device 60 may include a single first extending member 61, a single leg 62 configured to be movable along the first extending member 61 and a second extending member 64 connected to this leg 62. Further, the moving device 60 may include a rail extended in, for example, the Y-axis direction and a horizontal multi-joint robot configured to be movable along this rail. In this case, the imaging unit 50 is mounted to, for example, a leading end of an arm of the horizontal multi-joint robot and is movable in the X-axis direction by the horizontal multi-joint robot.

Further, in the above-stated exemplary embodiment, the first holder 20 and the second holder 30 are disposed to face each other in the vertical direction, and the second holder 30 is disposed under the first holder 20. However, the layout of the first holder 20 and the second holder 30 is not limited to the shown example.

Further, the above exemplary embodiment has been described for the example where the third imaging device 70 is a transmission type imaging device. However, the third imaging device 70 may be a reflection type imaging device. If the reflection type imaging device is used as the third imaging device 70, the through hole 121 of the second vessel 12, the transparent member 122 and the light source 80 are not necessary. Thus, the structure of the vacuum bonding apparatus 110 can be simplified.

As stated above, the bonding apparatus (for example, the vacuum bonding apparatus 110) according to the exemplary embodiment is equipped with the first holder 20, the second holder 30, the imaging unit 50 and the moving device 60. The first holder 20 holds the first substrate W1. The second holder 30 is disposed to face the first holder 20 and holds the second substrate W2 to be bonded to the first substrate W1. The imaging unit 50 includes: the first imaging device 51 configured to image the first alignment mark M1 formed on the surface of the first substrate W1 facing the second substrate W2; and the second imaging device 52 configured to image the second alignment mark M2 formed on the surface of the second substrate W2 facing the first substrate W1. The moving device 60 moves the imaging unit 50 in a first direction (for example, the X-axis direction) and a second direction (for example, the Y-axis direction) intersecting with the first direction within the plan region between the first holder 20 and the second holder 30.

The alignment mark may not always be provided at the same position with respect to the substrate. For example, the alignment mark may be provided at a periphery of the substrate or a position inner than that. According to the bonding apparatus of the present exemplary embodiment, even when the alignment mark is provided on a certain position, the imaging unit 50 can be moved to the corresponding position by using the moving device 60. Further, since the moving device 60 moves the first imaging device 51 and the second imaging device 52 as one body, the deviation in the imaging position between the first imaging device 51 and the second imaging device 52 which might be caused by the movement of the first holder 51 and the second holder 52 may not occur easily. With these configurations, the accuracy of the alignment processing can be improved, and the position deviation between the first substrate W1 and the second substrate W2 can be suppressed.

Further, in the imaging unit 50, the optical axis of the objective lens (for example, the first wide-area objective lens 513, the first local objective lens 515) belonging to the first imaging device 51 and the optical axis of the objective lens (for example, the second wide-area objective lens 523, the second topical objective lens 525) belonging to the second imaging device 52 may be arranged on the same straight line.

With this configuration, when imaging the region on the first substrate W1 centered around certain coordinate thereof by the first imaging device 51, the region on the second substrate W2 centered around the same coordinate can be imaged by the second imaging device 52. Accordingly, in the alignment processing, for example, it is possible to easily allow the processing of aligning the position of the first alignment mark M1 provided on the first substrate W1 with the position of the second alignment mark M2 provided on the second substrate W2.

Further, the first imaging device 51 may be equipped with a first objective lens (for example, the first wide-area objective lens 513) and a second objective lens (for example, the first local objective lens 515) having a magnification higher than that of the first objective lens. Further, the second imaging device 52 may be equipped with a third objective lens (for example, the second wide-area objective lens 523) and a fourth objective lens (for example, the second topical objective lens 525) having a magnification higher than that of the third objective lens. In this case, in the imaging unit 50, an optical axis of the first objective lens and an optical axis of the third objective lens may lie on the same straight line, and an optical axis of the second objective lens and an optical axis of the fourth objective lens may lie on the same straight line.

Accordingly, in the pre-alignment processing and the fine alignment processing, for example, the processing of aligning the position of the first alignment mark M1 provided on the first substrate W1 with the position of the second alignment mark M2 provided on the second substrate W2 can be easily performed.

Further, the moving device 60 may include the first extending member 61, the leg 62, the first driver 63, the second extending member 64 and the second driver 66. The first extending member 61 is extended in one (for example, the X-axis direction) of the first direction and the second direction. The leg 62 is connected to the first extending member 61. The first driver 63 moves the leg 62 along the first extending member 61. The second extending member 64 is connected to the leg 62 and extended in the other (for example, the Y-axis direction) of the first direction and the second direction. The second driver 66 moves the imaging unit 50 along the second extending member 64.

Accordingly, the imaging unit 50 can be moved in the first direction and the second direction intersecting with the first direction within the plan region between the first holder 20 and the second holder 30.

Furthermore, the bonding apparatus according to the exemplary embodiment may be further equipped with the chamber 10. The chamber 10 is equipped with the first vessel 11 having the open side facing the second holder 30 and configured to accommodate the first holder 20 therein, the second vessel 12 having the open side facing the first holder 20 and configured to accommodate the second holder 30 therein, and the opening/closing device 13 configured to move the first vessel 11. By moving the first vessel 11 with the opening/closing device 13 to be brought into contact with the second vessel 12, a sealed processing space is formed within the chamber 10. In this case, the moving device 60 moves the imaging unit 50 between the imaging position between the first holder 20 and the second holder 30 and the retreat position at the outside of the chamber 10 in the state that the first vessel 11 and the second vessel 12 are spaced apart from each other.

Accordingly, by disposing the imaging unit 50 between the first holder 20 and the second holder 30, the first alignment mark M1 and the second alignment mark M2 can be imaged. Further, when forming the processing space within the chamber 10, the imaging unit 50 can be retreated to the outside of the chamber 10.

In addition, the bonding apparatus according to the exemplary embodiment may be further equipped with a first transparent member (for example, the transparent member 22), a second transparent member (for example, the transparent member 32), a third transparent member (for example, the transparent member 112) and the third imaging device 70. The first transparent member is provided at an outer peripheral portion of the first holder 20, and a third alignment mark (for example, the first chuck mark M3) is formed thereat. The second transparent member is provided at an outer peripheral portion of the second holder 30 to be placed at a position facing the first transparent member, and a fourth alignment mark (for example, the second chuck mark M4) is formed at the second transparent member. The third transparent member is provided at a position facing the first transparent member within the first vessel 11. The third imaging device 70 images the third alignment mark formed at the first transparent member via the third transparent member from the outside of the chamber 10, and images the fourth alignment mark formed at the second transparent member via the third transparent member and the first transparent member from the outside of the chamber 10.

Thus, even after the chamber 10 is closed, the third alignment mark and the fourth alignment mark placed within the chamber 10 can be imaged by the third imaging device 70 from the outside of the chamber 10.

Moreover, the first vessel 11 has the through hole 111 through which the inside and the outside of the processing space communicate, and the third transparent member may be placed near the processing space within the through hole 111. Furthermore, in this case, at least a part of the objective lens 72 belonging to the third imaging device 70 may be disposed within the through hole 111.

Accordingly, the objective lens 72 of the third imaging device 70 can be made to approach closer to the third alignment mark and the fourth alignment mark as the observation target. Thus, even if the focal length of the objective lens 72 is short, the objective lens 72 can be appropriately focused on the third alignment mark and the fourth alignment mark.

Besides, the bonding apparatus according to the exemplary embodiment may be further equipped with the adjuster 21 and a controller (as an example, the control device 200). The adjuster 21 adjusts the horizontal position of the first holder 20. The controller controls the imaging unit 50, the moving device 60, the opening/closing device 13, the third imaging devices 70 and the adjuster 21. Further, the controller performs a first imaging processing (for example, the topical imaging processing), a first alignment processing (for example, the first fine alignment processing), a second imaging processing (for example, the first chuck mark imaging processing), a chamber closing processing, a third imaging processing (for example, the second chuck mark imaging processing), and a second alignment processing (for example, the second fine alignment processing). In the first imaging processing, the imaging unit 50 is located at the imaging position between the first holder 20 and the second holder 30, and the first alignment marks M1 and the second alignment marks M2 are imaged. In the first alignment processing, the horizontal position of the first holder 20 is adjusted by using the adjuster 21 based on the result of the first imaging processing. In the second imaging processing, the imaging unit 50 is placed at the imaging position between the first transparent member and the second transparent member after the first alignment processing, and the third alignment marks and the fourth alignment marks are imaged. In the chamber closing processing, the first vessel 11 is moved to be brought into contact with the second vessel 12 after the second imaging processing, so that the processing space is formed within the chamber 10. In the third imaging processing, the third alignment marks and the fourth alignment marks are imaged by using the third imaging devices 70 after the chamber closing processing. In the second alignment processing, the horizontal position of the first holder 20 is adjusted by using the adjuster 21 based on the result of the second imaging processing and the result of the third imaging processing after the third imaging processing.

Accordingly, even if the position-determined state of the first substrate W1 and the second substrate W2 in the first alignment processing is disturbed by the subsequent chamber closing processing, the first substrate W1 and the second substrate W2 can be returned to the state where they are position-determined. Therefore, the first substrate W1 and the second substrate W2 can be bonded with high accuracy.

The exemplary embodiments stated above are not intended to be anyway limiting. The above-described exemplary embodiments may be omitted, substituted and modified in various ways without departing from the scope and the spirit of claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A bonding apparatus, comprising:
   a first holder configured to hold a first substrate;
   a second holder disposed to face the first holder and configured to hold a second substrate to be bonded to the first substrate;
   an imaging unit comprising a first imaging device configured to image a first alignment mark formed on a surface of the first substrate facing the second substrate and a second imaging device configured to image a second alignment mark formed on a surface of the second substrate facing the first substrate;
   a moving device configured to move the imaging unit in a first direction and a second direction intersecting with the first direction within a plan region between the first holder and the second holder;
   a first transparent member, provided at an outer edge of the first holder, having a third alignment mark formed thereon; and
   a second transparent member, provided at an outer edge of the second holder to be placed at a position facing the first transparent member, having a fourth alignment mark formed thereon;
   wherein, in the imaging unit, an optical axis of an objective lens belonging to the first imaging device and an optical axis of an objective lens belonging to the second imaging device lie on a same straight line at all times, and
   the imaging unit further comprises a third imaging device configured to image the third alignment mark and the forth alignment mark.

2. The bonding apparatus of claim 1,
   wherein the first imaging device comprises a first objective lens and a second objective lens having a magnification higher than that of the first objective lens,
   the second imaging device comprises a third objective lens and a fourth objective lens having a magnification higher than that of the third objective lens, and
   in the imaging unit, an optical axis of the first objective lens and an optical axis of the third objective lens lie on a same straight line, and an optical axis of the second objective lens and an optical axis of the fourth objective lens line on a same straight line.

3. The bonding apparatus of claim 1,
   wherein the moving device comprises:
   a first extending member extended in one of the first direction and the second direction;
   a leg connected to the first extending member;

a first driver configured to move the leg along the first extending member;
a second extending member connected to the leg and extended in the other of the first direction and the second direction; and
a second driver configured to move the imaging unit along the second extending member.

4. The bonding apparatus of claim 1,
wherein the moving device moves the imaging unit between an imaging position between the first holder and the second holder and a retreat position provided at an outside of the chamber in a state that the first vessel and the second vessel are spaced apart from each other.

5. The bonding apparatus of claim 1,
wherein the first vessel has a through hole through which an inside and an outside of the processing space communicate,
the third transparent member is disposed near the processing space within the through hole, and
at least a part of an objective lens belonging to the third imaging device is placed within the through hole.

6. The bonding apparatus of claim 1, further comprising:
an adjuster configured to adjust a horizontal position of the first holder; and
a controller configured to control the imaging unit, the moving device, the opening/closing device, the third imaging device and the adjuster,
wherein the controller performs: a first imaging processing of placing the imaging unit at the imaging position between the first holder and the second holder to image the first alignment mark and the second alignment mark; a first alignment processing of adjusting the horizontal position of the first holder by the adjuster based on a result of the first imaging processing; a second imaging processing of placing, after the first alignment processing, the imaging unit at an imaging position between the first transparent member and the second transparent member to image the third alignment mark and the fourth alignment mark; a chamber closing processing of bringing, after the second imaging processing, the first vessel into contact with the second vessel to form the processing space within the chamber; a third imaging processing of imaging, after the chamber closing processing, the third alignment mark and the fourth alignment mark by the third imaging device; and a second alignment processing of adjusting, after the third imaging processing, the horizontal position of the first holder by the adjuster based on a result of the second imaging processing and a result of the third imaging processing.

7. A bonding method of bonding a first substrate and a second substrate by using a bonding apparatus, comprising:
holding the first substrate by a first holder;
holding the second substrate by a second holder disposed to face the first holder;
moving an imaging unit by a moving device configured to move the imaging unit in a first direction and a second direction intersecting with the first direction within a plan region between the first holder and the second holder, the imaging unit comprising a first imaging device configured to image a first alignment mark formed on a surface of the first substrate facing the second substrate, a second imaging device configured to image a second alignment mark formed on a surface of the second substrate facing the first substrate, and a third imaging device configured to image a third alignment mark and a fourth alignment mark; and
imaging the first alignment mark and the second alignment mark by the imaging unit,
wherein, in the imaging unit, an optical axis of an objective lens belonging to the first imaging device and an optical axis of an objective lens belonging to the second imaging device lie on a same straight line at all times,
wherein the third alignment mark is formed on a first transparent member which is provided at an outer edge of the first holder,
the fourth alignment mark is formed on a second transparent member which is provided at an outer edge of the second holder, and
the bonding apparatus comprises a chamber comprising a first vessel having an open side facing the second holder, the first vessel configured to accommodate therein the first holder; a second vessel having an open side facing the first holder, the second vessel configured to accommodate therein the second holder; and an opening/closing device configured to move the first vessel, wherein the chamber forms therein a sealed processing space by moving the first vessel with the opening/closing device to bring the first vessel into contact with the second vessel,
wherein the bonding method further comprises,
imaging, through a third transparent member from the outside of the chamber, the third alignment mark formed on the first transparent member by the third imaging device, the third transparent member provided at a position of the first vessel facing the first transparent member, and
imaging, through the third transparent member and the first transparent member from the outside of the chamber, the fourth alignment mark formed on the second transparent member by the third imaging device.

* * * * *

UNITED STATES PATENT AND TRADEMARK OFFICE
CERTIFICATE OF CORRECTION

| | |
|---|---|
| PATENT NO. | : 11,417,543 B2 |
| APPLICATION NO. | : 16/508507 |
| DATED | : August 16, 2022 |
| INVENTOR(S) | : Yoshitaka Otsuka et al. |

It is certified that error appears in the above-identified patent and that said Letters Patent is hereby corrected as shown below:

In the Claims

Column 18, Lines 43-50:
"wherein, in the imaging unit, an optical axis of an objective lens belonging to the first imaging device and an optical axis of an objective lens belonging to the second imaging device lie on a same straight line at all times, and
the imaging unit further comprises a third imaging device configured to image the third alignment mark and the forth alignment mark."

Should be:
-- a chamber comprising a first vessel having an open side facing the second holder, the first vessel configured to accommodate therein the first holder; a second vessel having an open side facing the first holder, the second vessel configured to accommodate therein the second holder; and an opening/closing device configured to move the first vessel, wherein the chamber forms therein a sealed processing space by moving the first vessel with the opening/closing device to bring the first vessel into contact with the second vessel, and
a third transparent member provided at a position of the first vessel facing the first transparent member;
wherein, in the imaging unit, an optical axis of an objective lens belonging to the first imaging device and an optical axis of an objective lens belonging to the second imaging device lie on a same straight line at all times,
wherein the imaging unit further comprises a third imaging device configured to:
image, through the third transparent member from the outside of the chamber, the third alignment mark formed on the first transparent member; and
image, through the third transparent member and the first transparent member from the outside of the chamber, the fourth alignment mark formed on the second transparent member. --

Signed and Sealed this
Fourth Day of July, 2023

Katherine Kelly Vidal
*Director of the United States Patent and Trademark Office*